United States Patent [19]
Przybysz et al.

[11] 4,381,341
[45] Apr. 26, 1983

[54] TWO STAGE ETCHING PROCESS FOR THROUGH THE SUBSTRATE CONTACTS

[75] Inventors: John X. Przybysz, Penn Hills; Michael C. Driver, Monroeville; Harvey C. Nathanson, Pittsburgh, all of Pa.

[73] Assignee: Westinghouse Electric Corp., Pittsburgh, Pa.

[21] Appl. No.: 344,467

[22] Filed: Feb. 1, 1982

[51] Int. Cl.³ .................... H01L 21/312; B44C 1/22; C03C 15/00; C03C 25/06
[52] U.S. Cl. .................... 430/312; 29/580; 156/644; 156/651; 156/661.1; 357/55; 427/88; 430/316
[58] Field of Search ............ 156/644, 652, 651, 659.1, 156/661.1, 662; 357/55, 65; 427/88, 89, 90; 204/15, 32 S, 192 EC; 29/580, 583, 589, 590; 430/312, 313, 316

[56] References Cited
U.S. PATENT DOCUMENTS
3,493,820  2/1970  Rosvold .................... 156/662 X OTHER PUBLICATIONS
IEEE Transactions on Electron Devices, vol. ED-28, No. 2, Feb. 1981, Monolithic Microwave Amplifiers Formed by Ion Implantation into LEC, Gallium Arsenide Substrates by M. C. Driver et al., pp. 191-196.

Primary Examiner—William A. Powell
Attorney, Agent, or Firm—W. G. Sutcliff

[57] ABSTRACT

Electrical interconnection paths or vias are provided through relatively thick III/V semiconductive substrates, such as gallium arsenide, to permit through the substrate electrical interconnection of planar transistor devices. The vias are etched in a two-step process which ensures that the via lateral dimensions are less than the transistor contacts with which they are aligned. The first step comprises selectively thinning the thick substrate from the back surface over an area which encompasses the transistor array formed in the front surface of the substrate. The second step is to etch the individual vias through this prior thinned substrate at areas aligned with the transistor contacts.

4 Claims, 10 Drawing Figures

4,381,341

TWO STAGE ETCHING PROCESS FOR THROUGH THE SUBSTRATE CONTACTS

GOVERNMENT CONTRACT CLAUSE

This invention was made or conceived in the course of, or under, a contract with the Department of the Navy identified as No. N00014-78-C-0268.

BACKGROUND OF THE INVENTION

The present invention relates to gallium arsenide integrated circuits, and more particularly to a method of fabrication of such circuits.

Integrated circuits are widely used in modern radar systems and electronic countermeasure systems. For higher frequency systems above about 5 GHZ, gallium arsenide devices are preferred to silicon devices because of the higher carrier velocity in gallium arsenide, and because it can be easily prepared as an insulating substrate for the formation of monolithic integrated circuits. Such circuits and fabrication techniques are set forth in, "Monolithic Microwave Amplifiers Formed by Ion Implantation into LEC Gallium Arsenide Substrates", IEEE Transactions On Electron Devices, Vol. ED 28, No. 2, February 1981.

Gallium arsenide integrated circuits are formed using Schottky barrier gate, field effect transistors. A plurality of transistor contacts are generally connected in electrical parallel to achieve reasonable power operation. With a plurality of transistor gates in parallel it is not possible to electrically interconnect the plural sources, drain and gates in a planar fashion without some means of crossing one interconnection over the others. In discrete devices, stitch bonding of small diameter wires has been used to make these parallel interconnections, but is extremely labor intensive and yields unreliable electrical contact. Such stitch bonded wires also add parasitic inductance to the circuit which can seriously degrade transistor gain.

For prior art discrete gallium arsenide devices, the substrate is typically very thin, only about 30 micrometers, and it was therefore possible to form apertures or vias through the substrate beneath a transistor source or drain contact. An electrical interconnect could then be made through the via to eliminate the need for the stitch wire bond interconnect. This via formation in very thin gallium arsenide substrates was by a single stage wet chemical etch process, as generally set forth in copending application Ser. No. 292,977, filed Aug. 14, 1981, entitled "Wet Chemical Etching of III/V Semiconductor Material Without Gas Evaluation", owned by the assignee of the present invention.

The gallium arsenide substrate thickness for producing monolithic microwave amplifiers and other such integrated circuits must typically be about 100 micrometers thick. This thickness is necessary to keep circuit losses acceptably low, while maintaining satisfactory heat-transfer characteristics for the power field effect transistors. It had not been found possible to fabricate interconnection vias through such thicker substrates, i.e. 100 micrometers, without the vias become too large in diameter and exceeding the area of the transistor contact with which the via is aligned.

SUMMARY OF THE INVENTION

A method has been devised for providing vias through relatively thick gallium arsenide or other type III/V semiconductive substrates to permit electrical interconnection of integrated circuit conductors disposed on the active surface by metal deposited in the vias and extending through the substrate to the back surface. The method is a two stage etching process, with the first stage comprising selectively thinning the substrate from the side opposed to the active circuit side of the substrate. This selectively thinned substrate area exceeds the area of the integrated circuit conductors which are typically transistor source or drain pads, and the substrate is thinned to from about 10–25 micrometers. Then in the second step, a via is etched through the already selectively thinned substrate area which is aligned with the conductor or transistor contact to produce an electrical interconnection via of a diameter smaller than the aligned conductor.

DESCRIPTION OF THE PREFERRED EMBODIMENT

Figure 1A:
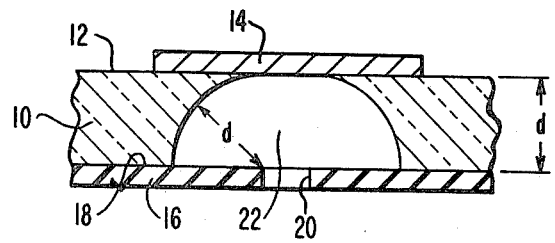
FIG. 1A is a cross sectional representation which illustrates the prior art via etching for very thin gallium arsenide substrates.

The prior art via fabrication through 30 micrometer thick gallium arsenide substrate is illustrated in FIG. 1A. The substrate 10 has an active circuit surface 12 in which a field effect transistor, not shown, is formed with a transistor contact 14 provided on the substrate surface 12. A photoresist etch mask 16 is provided on the opposed substrate back surface 18. An etch mask aperture 20 aligned with the contact 14 is formed in mask 16. The substrate thickness is designated D, and an etched via 22 is formed extending through the substrate to the contact. The etching solution is isotropic acting uniformly in all directions, and thus the via 22 is generally conic, with etching of the substrate being a dimension d as measured from the aperture 20.

Figure 1B:
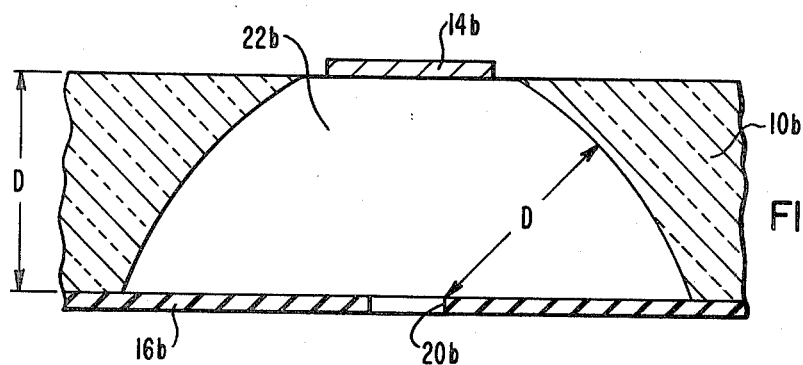
FIG. 1B is a cross-sectional representation which illustrates the problem of trying to etch through relatively thick gallium arsenide substrates.

FIG. 1B illustrates the problem in trying to etch through a relatively thick gallium arsenide substrate, such as is required to be about 100 micrometer thick for forming monolithic integrated circuits. The substrate 10b has a thickness D which exceeds the dimensions of the transistor contact 14b. When etching is carried out through mask 16b and aperture 20b, the etched via 22b is again conic and has a volume defined by the dimension D from the aperture 20b. The via volume extends beyond the aligned contact 14b and can etch away other adjacent transistor areas, such as the channel which is closely spaced from the transistor source.

Figure 2:
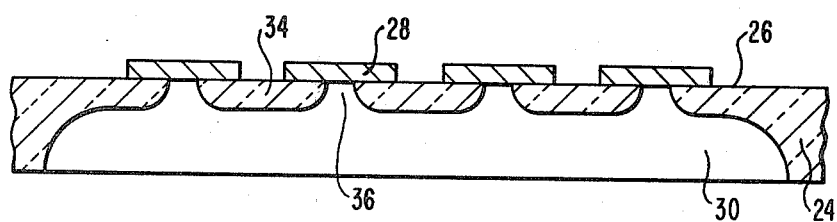
FIG. 2 is a cross-sectional representation which illustrates the structures produced by the present invention.

The method of the present invention is illustrated in detail in FIGS. 3A through 3G, and a resultant structure seen in FIG. 2. In FIG. 2, a gallium arsenide substrate 24 is about 100 micrometers thick, and has an active circuit surface 26. A plurality of conductive transistor contact pads 28 are shown deposited on surface 26, aligned with respective transistor regions not shown in the active surface 26. A thinned area or tub region 30 is formed from the back surface 32 into substrate 24, which thinned area 30 extends laterally beyond the areas of the transistor contacts. The thinned substrate portion 34 which remain with the tub region 30 is only about 10 to 25 micrometers thick. A plurality of vias 36 are formed through the thinned substrate 34, which vias 36 are aligned with the contacts 28, and which vias have a lateral dimension smaller than the contact dimension.

Figure 3A:
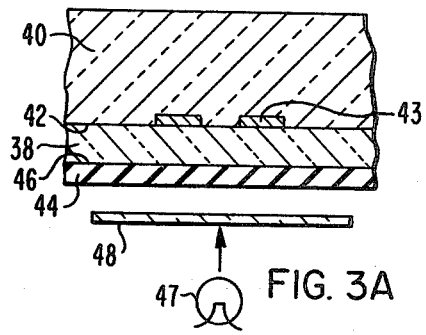
FIGS. 3A through 3G are cross-sectional representations of the various steps in carrying out the present invention.
Figure 3E:
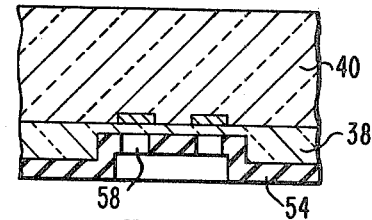
Figure 3B:
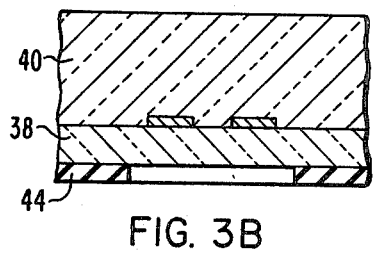
Figure 3F:
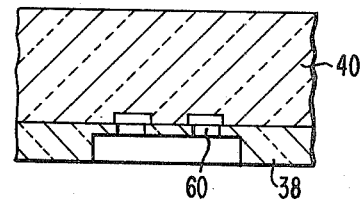
Figure 3C:
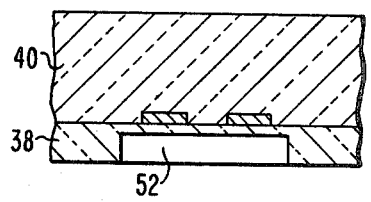
Figure 3G:
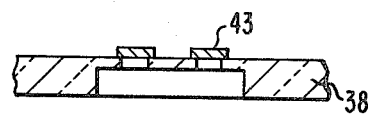
Figure 3D:
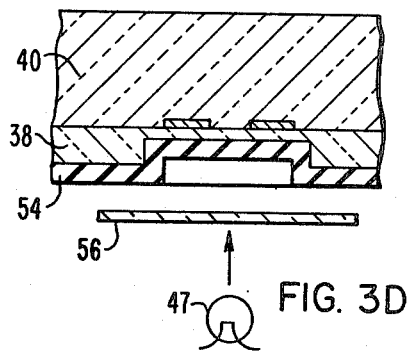

The two stage via formation method of the present invention is illustrated in step-by-step sequence in FIGS. 3A through 3G. As seen in FIG. 3A the gallium arsenide substrate 38 is mounted on a glass support plate 40 with the active circuit surface 42 with transistor contacts 43 deposited selectively on the surface 42 mated to the plate 40. A first photoresist layer 44 is disposed on the opposed substrate surface 46. This is preferably a positive acting photoresist, such as AZ1350J applied by spraying. The first photoresist layer 44 is selectively exposed to polymerizing radiation from source 47 through photolithography mask 48. In FIG. 3b a selectively exposed polymerized portion is removed forming aperture 50 in layer 44. The substrate 38 is ready for selective thinning by etching a large area tub region 52 as seen in FIG. 3C after the selective etch thinning of substrate 38 and removal of the photoresist 44. The substrate is now ready for the second stage of via formation. In FIG. 3D a second photoresist layer 54 is provided over back surface of the substrate including the selectively thinned tub area 52. Again, polymerizing radiation from source 47 is selectively directed through photolithography exposure mask 56 to permit formation of a plurality of small diameter apertures 58, in resist layer 54 as seen in FIG. 3E after removal of the selectively exposed areas. This second apertured photoresist layer 54 then serves as the final etching mask for etching through the gallium arsenide substrate 38 to form vias 60 therethrough as seen in FIG. 3F. In FIG. 3G, the glass plate 40 is shown removed and the gallium arsenide substrate is now ready for conductive metal to be disposed in the vias 60, such as by sputtering and then electroplating gold into the vias and onto the back surface of the substrate. In actual fabrication, the conductive metal is normally filled into the vias 60 and disposed on the back surface of the substrate before removing the glass plate.

The preferred etching solution utilized is a described in the aforementioned copending application, which etching solution in general comprises a solution of phosphoric acid, hydrogen peroxide, water, and ammonium fluoride in a volume ratio of 50:25:25:1.

A typical transistor source contact pad is about twice the dimension area or of the generally conic via with which it is aligned.

The power capacity of gallium arsenide microwave transistors is significantly reduced with increased operating temperature. This thermal impedance becomes more of a problem for the thicker 100 micrometer substrates needed for integrated circuits. The heat is generated at the active surface of the substrate, and conductive vias through the substrate to the ground plane electrode which is heat sinked can significantly lower the thermal impedance of the devices. These conductive vias provide a low source inductance, and permit grounding at various locations on the substrate.

The array of microwave transistors is fabricated in a thin surface layer which is only a few micrometers thick extending into the substrate from the active circuit surface. The microwave transistors are planar surface effect devices and are not shown in the drawings because of the minimal thickness of the transistor regions. The transistor contacts are typically conductive metal deposits atop the respective transistor regions, which contacts are thicker than the transistor regions.

We claim:

1. Method of providing a plurality of electrical interconnection vias through an integrated circuit substrate wherein a plurality of transistor devices are formed on one side of the substrate with a plurality of transistor contacts disposed on the substrate surface in electrical contact with transistor regions, wherein the respective interconnection vias are aligned with and are smaller in area than the transistor contacts with which they are respectively aligned, which method comprises;
   (a) selectively thinning the substrate from the side opposed to the side on which the transistor devices and transistor contacts are disposed, which selectively thinned substrate area exceeds the transistor contact area;
   (b) etching through portions of the selectively thinned substrate area which is aligned with the transistor contacts to produce electrical interconnection vias of an area smaller than the transistor contact area.

2. The method set forth in claim 1, wherein the selective thinning of the substrate is carried out by mounting the substrate transistor device side down on a glass support slide, depositing a first photoresist layer on the exposed back surface of the substrate, and selectively exposing the photoresist to polymerizing radiation, and etching away these selectively exposed photoresist layer areas, and thereafter etching away the substrate portions from which the photoresist has been etched to selectively thin the substrate.

3. The method set forth in claim 2, wherein the etchings through portions of the selectively thinned substrate to produce the interconnection vias is carried out by depositing a second photoresist layer on the selectively thinned substrate, selectively exposing the second photoresist layer to polymerizing radiation in substrate areas aligned with but smaller in area then the transistor contacts, and etching away these selectively exposed photoresist areas to permit etching through portions of the selectively thinned substrate to produce the electrical interconnection vias.

4. The method set forth in claim 3, wherein conductive metal is deposited in the electrical interconnection vias making electrical contact with the transistor contacts with which the vias are aligned, and which deposited conductive metal extends through the substrate to a ground plane electrode deposited on the substrate surface opposite the transistor surface.

* * * * *